US011812600B2

(12) United States Patent
Sung et al.

(10) Patent No.: US 11,812,600 B2
(45) Date of Patent: Nov. 7, 2023

(54) VERTICAL MEMORY CELL WITH SELF-ALIGNED THIN FILM TRANSISTOR

(71) Applicant: Intel Corporation, Santa Clara, CA (US)

(72) Inventors: Seung Hoon Sung, Portland, OR (US); Charles C. Kuo, Hillsboro, OR (US); Abhishek A. Sharma, Hillsboro, OR (US); Van H. Le, Beaverton, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 826 days.

(21) Appl. No.: 16/452,099

(22) Filed: Jun. 25, 2019

(65) Prior Publication Data
US 2020/0411528 A1 Dec. 31, 2020

(51) Int. Cl.
  *H10B 12/00* (2023.01)
  *H01L 29/66* (2006.01)
  *H01L 29/423* (2006.01)
  *H01L 29/786* (2006.01)

(52) U.S. Cl.
  CPC ....... *H10B 12/05* (2023.02); *H01L 29/42392* (2013.01); *H01L 29/66742* (2013.01); *H01L 29/78642* (2013.01); *H01L 29/78696* (2013.01); *H10B 12/036* (2023.02); *H10B 12/33* (2023.02); *H10B 12/482* (2023.02)

(58) Field of Classification Search
  CPC ...... H10B 12/036; H10B 12/33; H10B 12/34; H10B 12/37; H10B 12/373; H10B 12/39
  See application file for complete search history.

(56) References Cited

U.S. PATENT DOCUMENTS

| 5,291,438 A | 3/1994 | Witek et al. |
| 7,767,519 B2 | 8/2010 | Doyle et al. |
| 2002/0119621 A1* | 8/2002 | Lin .................... H10B 12/0387 438/242 |

(Continued)

OTHER PUBLICATIONS

"Dynamic Random-Access Memory" from Wikipedia, retrieved online on Apr. 5, 2019, retrieved on URL: https://en.wikipedia.org/wiki/Dynamic_random-access_memory, last edited Mar. 14, 2019, 17 pages.

*Primary Examiner* — Jae Lee
(74) *Attorney, Agent, or Firm* — Schwabe, Williamson & Wyatt, P.C.

(57) ABSTRACT

An integrated circuit includes one or more layers of insulating material defining a vertical bore with a first portion and a second portion. A capacitor structure is in the first portion of the vertical bore and includes a first electrode, a second electrode, and a dielectric between the first electrode and the second electrode. A transistor structure is in the second portion of the vertical bore and includes a third electrode extending into the second portion of the vertical bore, a layer of semiconductor material in contact with the first electrode and in contact with the second electrode, and a dielectric between the semiconductor material and the insulating material. A fourth electrode wraps around the transistor structure such that the dielectric is between the semiconductor material and the fourth electrode. The capacitor structure can be above or below the transistor structure in a self-aligned vertical arrangement.

22 Claims, 8 Drawing Sheets

(56) References Cited

U.S. PATENT DOCUMENTS

| | | | | |
|---|---|---|---|---|
| 2013/0134491 A1* | 5/2013 | Messenger | ........ | H01L 21/76898 |
| | | | | 438/389 |
| 2015/0348977 A1* | 12/2015 | Barth, Jr. | ............ | H01L 27/1203 |
| | | | | 257/302 |
| 2016/0126245 A1* | 5/2016 | Liu | ....................... | H01L 21/308 |
| | | | | 438/241 |

* cited by examiner

VERTICAL MEMORY CELL WITH SELF-ALIGNED THIN FILM TRANSISTOR

BACKGROUND

Semiconductor devices are electronic components that exploit the electronic properties of semiconductor materials, such as silicon (Si), germanium (Ge), gallium arsenide (GaAs), and indium phosphide (InP), to name a few examples. A field effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits. A thin-film transistor (TFT) is one type of FET that can be fabricated on a substrate, for example, by depositing and patterning thin films of semiconductor material, dielectric material, and metal.

Capacitors have been an important circuit element used in semiconductor circuit designs for many years. For example, capacitors are widely used in memory structures, such as dynamic random-access memory (DRAM) memory cells, active and passive filters, analog-to-digital (A/D) and digital-to-analog (D/A) converters, operational amplifiers, and many other circuits. In its simplest form, a capacitor has two conducting surfaces separated by an insulating material. A capacitor can store electrical charge, block the flow of direct current (DC), and can permit the flow of alternating current (AC) depending on the frequency of the incoming signal and the capacitance of the device. Capacitors can be combined with one or more transistors to define a memory cell. One such memory cell has one transistor and one capacitor, referred to as 1T-1C. Another such memory cell has three transistors and one capacitor, referred to as 3T-1C.

BRIEF DESCRIPTION OF THE DRAWINGS

The figures depict various embodiments of the present disclosure for purposes of illustration only. Numerous variations, configurations, and other embodiments will be apparent from the following detailed discussion.

DETAILED DESCRIPTION

Disclosed are architectures and methodologies for vertical thin film transistors that are self-aligned with a capacitor above or below the transistor. The techniques are particularly well-suited to forming memory cells that have a transistor and capacitor, although other transistor-capacitor circuits will be appreciated. In one such example embodiment, a memory cell is in a trench that extends vertically through a horizontal conductor, such as a wordline conductor. First and second capacitor electrodes along with the intervening dielectric are in a lower portion of the trench and a transistor structure is above the capacitor in the upper portion of the trench. As viewed in a cross-sectional view, the trench defines sidewalls that are colinear along the capacitor and the transistor portions. In this sense, the transistor is self-aligned with the capacitor. Note that in other embodiments the capacitor can be located above the transistor. The self-aligned structure of the capacitor and the transistor in the trench eliminates the need for precise mask alignment between processes used to fabricate the capacitor and processes used to fabricate the transistor. Accordingly, the memory cells can be made smaller and arranged more densely, and continuously scaled to smaller nodes.

In one example methodology, the memory cell is fabricated using a self-aligned process. For example, a vertical bore is defined in an insulating material, where part of the bore extends through a wordline conductor. In one such embodiment, the lower portion of the bore is below the wordline conductor and the upper portion of the bore is even with or above the wordline conductor. A capacitor is fabricated in the lower portion of the bore and includes first and second capacitor electrodes separated from each other by a layer of high-κ dielectric. A transistor is fabricated in the upper portion of the bore and includes a film of semiconductor material in contact with a bitline electrode extending vertically into the upper portion of the bore. The semiconductor material also contacts the second (upper) capacitor electrode. The semiconductor material is separated from the wordline by a layer of high-κ dielectric, which may be continuous with the dielectric of the capacitor. In other embodiments, the transistor structure is fabricated in the lower portion of the bore and the capacitor structure is fabricated in the upper portion of the bore above the transistor, where the wordline wraps around the transistor structure in the lower portion of the bore. Numerous variations and embodiments will be apparent in light of the present disclosure.

General Overview

Dynamic random access memory (DRAM) is commonly used to store one bit of data in a memory cell that includes one capacitor and one transistor, where the capacitor is aligned over the transistor. Such arrangements are may be referred to as 1T-1C DRAM cells. During some fabrication methodologies, forming the capacitor over the transistor requires precise mask alignment between processes for the capacitor fabrication and processes for the transistor fabrication. Such mask alignment becomes increasingly difficult as the density of memory structures increases and/or the size of transistors decreases. Therefore, a need exists for improvements in memory cell architecture and fabrication methodologies. The present disclosure addresses this need and others.

In accordance with some embodiments, a memory cell is fabricated in a vertical bore or trench formed in insulating material. A capacitor structure is in a first portion of the vertical bore and includes a first capacitor electrode, a second capacitor electrode, and a dielectric between the first capacitor electrode and the second capacitor electrode. A transistor structure is in the second portion of the vertical bore and includes a first electrode (e.g., a bitline) extending into the second portion of the vertical bore, a layer of semiconductor material in contact with the first electrode and in contact with the second capacitor electrode, and a dielectric between the semiconductor material and the insulating material. A second electrode (e.g., a wordline) extends horizontally through the insulating material at a level of the second portion of the vertical bore. The second electrode wraps around the transistor structure such that the dielectric is between the semiconductor material and the second electrode. The capacitor structure can be above or below the transistor structure in a self-aligned vertical arrangement. A sidewall of the vertical bore is collinear along the transistor structure and the capacitor structure.

In one embodiment, the capacitor structure is located in the lower portion of the bore. The dielectric between the first and second capacitor electrodes also extends along a portion of the sidewall in the lower bore portion between the first capacitor electrode and the transistor structure. In some such embodiments, the dielectric of the capacitor electrode is continuous with the dielectric of the transistor structure in the upper bore portion. In some embodiments, the second capacitor electrode has a wider head portion and a narrower neck portion, resulting from the self-aligned fabrication process. For example, the second capacitor electrode generally defines a T-shape or a lollipop shape where the semiconductor material of the transistor structure contacts a top of the second capacitor electrode.

In some embodiments, the bore extends to a semiconductor substrate or conductive element below the insulating material. In one such embodiment, the substrate or conductive element is a third electrode, such as a select line. Numerous variations and embodiments will be apparent in light of the present disclosure.

As discussed herein, terms referencing direction, such as upward, downward, vertical, horizontal, left, right, front, back, etc., are used for convenience to describe integrated circuit structures on a base or substrate extending in a horizontal plane. Embodiments of the present disclosure are not limited by these directional references and it is contemplated that integrated circuits and device structures in accordance with the present disclosure could be used in any orientation.

Note that materials described as being "compositionally different" or "compositionally distinct" as used herein refers to two materials that have different chemical compositions. This compositional difference may be, for instance, by virtue of an element that is in one material but not the other (e.g., $SiO_2$ is compositionally different from $Si_3N_4$), or by way of one material having all the same elements as a second material but at least one of those elements is intentionally provided at a different concentration in one material relative to the other material (e.g., SiGe having 70 atomic percent germanium is compositionally different from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon.

As also used herein, the term "low-κ" refers to a material having a dielectric constant equal to or less than that of silicon dioxide ($SiO_2$), which has a value of 3.9 according to some measurement methods. Examples of low-κ materials include porous silicon dioxide, amorphous carbon, spin-on glass, silicon oxycarbides (SiOCH), fluorine-doped $SiO_2$, carbon-doped $SiO_2$, and silsesquioxanes, to provide a few examples. As also used herein, the term "high-κ" refers to materials having a dielectric constant greater than that of silicon dioxide ($SiO_2$). Examples of high-κ dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out to improve the quality of the high-κ material. Note that the stoichiometry of such high-κ dielectric compounds and other example materials provided herein may vary from one embodiment to the next, and such compounds represented without stoichiometric coefficients or values are intended to represent all forms of that compound or material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, TEM can be useful to show a cross section of an integrated circuit or die that includes a memory structure in which a transistor is self-aligned in a trench with a capacitor. For example, a TEM image can show sidewalls with a generally linear alignment along the transistor structure and the capacitor structure.

Example Structures

Figure 1A:
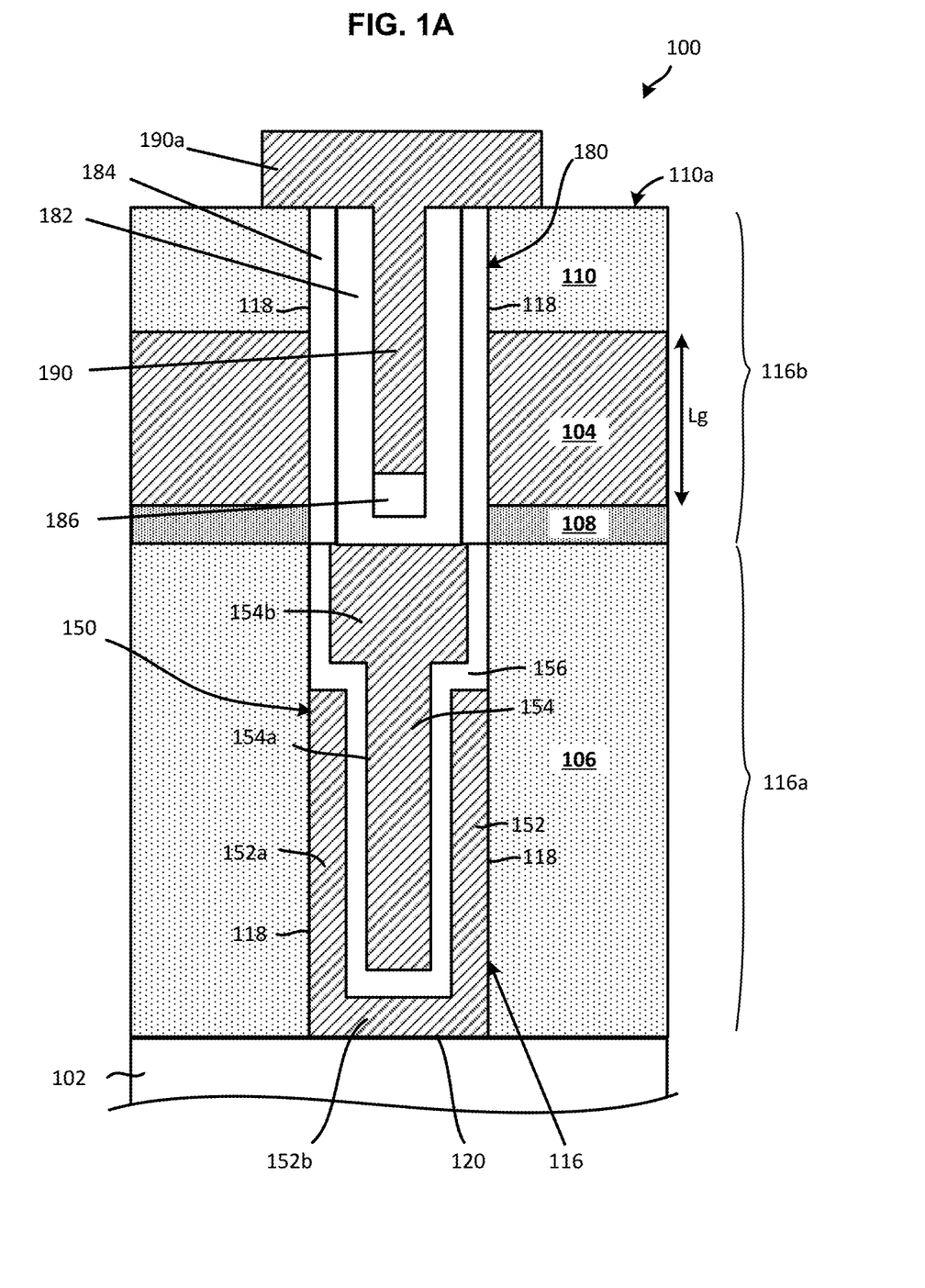
FIGS. 1A-1C are cross-sectional views showing a memory cell with a transistor structure vertically aligned over a capacitor structure, in accordance with some embodiments of the present disclosure.
Figure 1B:
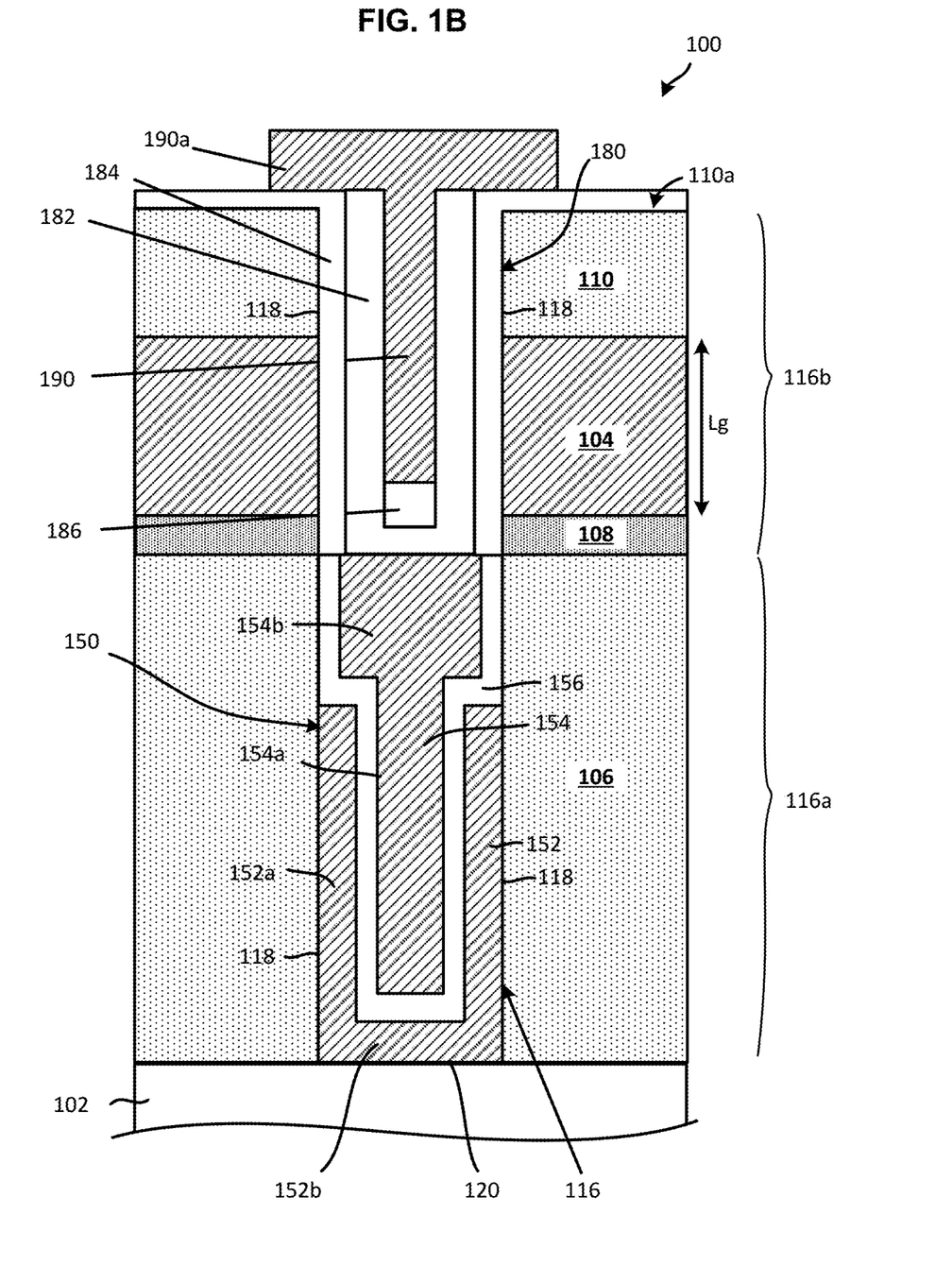
Figure 1C:
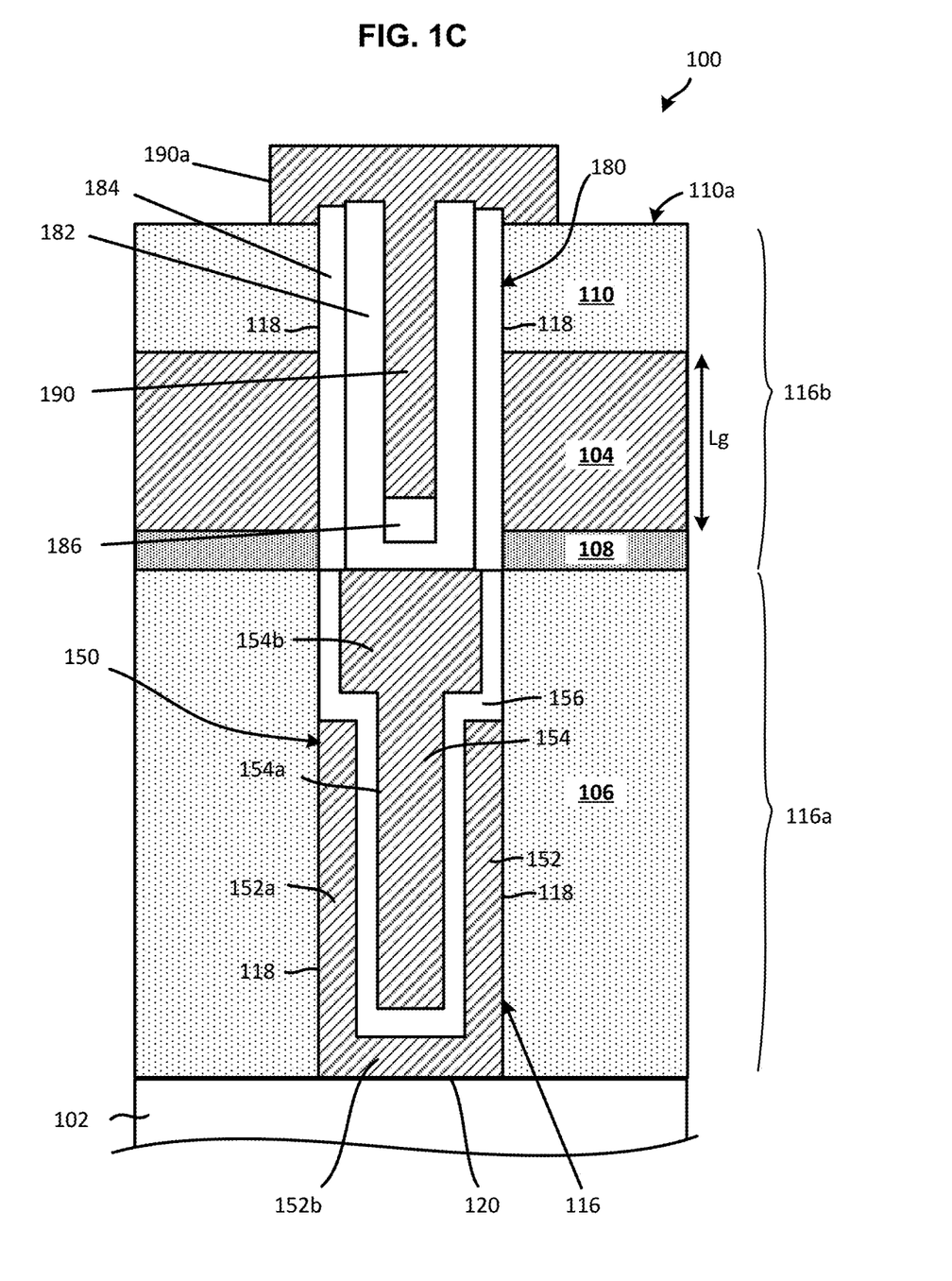

FIGS. 1A-1C illustrate a cross-sectional views of a memory cell 100 that includes a transistor 180 vertically aligned above a capacitor 150, in accordance with an embodiment of the present disclosure. In this example, memory cell 100 is in a bore or trench 116 that extends vertically through one or more insulating materials on a base or substrate 102. The substrate 102 can be or include a metal (e.g., aluminum, titanium nitride), a semiconductor material (e.g., silicon, gallium arsenide, or germanium), an insulator (e.g., silicon oxide), or a combination of these. On top of the substrate 102 is a layer of a first isolation material 106, a layer of a second isolation material 108 on the first isolation material 106, a conductor 104 on the second isolation material 108, and a layer of a third isolation material 110 on the conductor 104. The trench 116 extends vertically through the conductor 104 and isolation materials 106, 108, 110 to the substrate 102. The trench 116 has a lower trench portion 116a generally below the conductor 104 and an upper trench portion 116b generally at the conductor 104 and above. In some embodiments, the layer of second isolation material 108 is the first layer along the upper trench portion 116b. In some embodiments, the trench 116 is a bore extending into the substrate 102 and has a cylindrical, rectangular, or other cross-sectional shape.

In general, the first isolation material 106, second isolation material 108, and third isolation material 110 are selected as an insulating or low-κ dielectric, such as silicon oxide (e.g., SiO$_2$), silicon nitride (e.g., Si$_3$N$_4$), silicon oxycarbide (SiO$_x$C$_y$), silicon carbide nitride (SiCN), or porous versions of any of these, to name a few examples. In some embodiments, the second isolation material 108 is compositionally distinct from the first isolation material 106 so as to enable etch selectivity between the two layers. Similarly, the third isolation material 110 can be compositionally distinct from the second isolation material 106 so as to enable etch selectivity between the two layers. In one example embodiment, the first and third isolation materials 106, 110 are SiO$_2$ and the second isolation material 108 is Si$_3$N$_4$, or vice versa. In other embodiments, two or more of the isolation materials 106, 108, 110 have the same composition and may be deposited in the same process or in distinct processes. In some such embodiments, the isolation materials 106, 108, 110 may have the appearance of a single layer of isolation material. Numerous variations and embodiment will be apparent in light of the present disclosure.

The capacitor 150 includes a first capacitor electrode 152 and a second capacitor electrode 154 separated from one another by a high-κ dielectric 156. The first capacitor electrode 152 has sidewall portions 152a that extend vertically along sidewalls 118 of the lower trench portion 116a. The first capacitor electrode 152 also includes a bottom portion 152b that extends horizontally along the bottom 120 of the trench 116. In some such embodiments, a cross-section of the first capacitor electrode 152 defines a U-shape, for example. In one example, the bottom portion 152b contacts the base or substrate 102. In other embodiments, the trench 116 does not extend to the substrate 102, but instead terminates within the first isolation material 106 above the substrate 102. In such embodiments, the bottom portion 152b of the first capacitor electrode 152 extends along the bottom 120 of the trench 116 in contact with the first isolation material 106.

In one embodiment, the sidewall portions 152a of the first capacitor electrode 152 have a height that is less than the height of the lower trench portion 116a. In other words, the sidewall portion 152a of the first capacitor electrode 152 extends only along part of the sidewall 118 of the lower trench portion 116a, leaving a vertical gap between the top of the sidewall portion 152 and the second isolation material 108. A layer of high-κ dielectric 156 lines the inside of the first capacitor electrode 152 and portions of the sidewall 118 above the first capacitor electrode 152. For example, the high-κ dielectric 156 extends along the bottom portion 152b of the first capacitor electrode 152, along each sidewall portion 152a of the first capacitor electrode 152, and along the trench sidewalls 118 in the gap between the sidewall portion 152a of the first capacitor electrode 152 and the upper trench portion 116b. The second capacitor electrode 154 fills the region of the lower trench portion 116a between first capacitor electrode 152 and between the sidewalls 118 of the lower trench portion 116a, all of which are lined with the high-κ dielectric 156. In some such embodiments, the second capacitor electrode 154 has a head portion 154a above a narrower neck portion 154b, where the head portion 154 has a greater horizontal size than the neck portion 154b. For example, the head portion 154a and neck portion 154b of the second capacitor electrode 154 generally define a cross-sectional T-shape or a lollipop shape, depending on the definition of corners and other features, as will be appreciated.

The transistor 180, which is located above the capacitor 150 in this embodiment, includes a thin film of semiconductor material 182. The semiconductor material 182 may also be referred to as the channel region or channel material. In some embodiments, the semiconductor material 182 includes a bottom portion 182a extending horizontally along and in contact with the top of the second capacitor electrode 154 (e.g., contacts the top of head portion 154a). The semiconductor material 182 also includes side portions 182b that extend vertically up from the bottom portion 182a along the dielectric material 184 lining the trench sidewalls 118. In one such embodiment, the side portions 182b and the bottom portion 182b of the semiconductor material 182 generally define a U-shape that contacts the second conductor 190, which extends vertically into the upper trench portion 116b.

Examples of acceptable materials for the semiconductor material 182 include indium gallium zinc oxide (InGaZnO), indium oxide (e.g., InO or In$_2$O$_3$), indium tin oxide (InTnO or "ITO"), transition metal dichalcogenides (TMDs), to name a few examples. The semiconductor material 182 has a thickness of up to 10 nm in some example embodiments (e.g., 1-8 nm) and no more than 5 nm in other example embodiments (e.g., 2-5 nm).

Optionally, an insulating dielectric 186 (e.g., a tunnel oxide) is on the bottom portion 182a of the semiconductor material 182 in the bottom of the U-shape between the side portions 182b. The insulating dielectric 186 can be SiO$_2$ or other suitable insulating dielectric. The insulating dielectric 186 has a vertical thickness that is less than that of the conductor 104 (e.g., a gate length $L_g$ of wordline conductor 104), such as one-half, one-third, one-quarter, or other portion of the vertical thickness of the conductor 104. Accordingly, the insulating dielectric 186 is between side portions 182b of the semiconductor material along only part of the gate length $L_g$ of the semiconductor material 182a.

An electrode or second conductor 190 extends into the upper trench portion 116b between and in contact with side portions 182b of the semiconductor material 182. The second conductor 190 can include a top portion 190a above the trench 116. When present, the second conductor 190 may make contact with the insulating dielectric 186. In one such embodiment, the second conductor 190 is a bitline electrode of polysilicon, a metal, or other conductive material.

A high-κ dielectric 184 is between the semiconductor material 182 and the sidewalls 118 of the upper trench portion 116b. In one embodiment, the high-κ dielectric 184 lines the sidewalls 118 of the upper trench portion 116b from the high-κ dielectric 156 in the lower trench portion 116a to the top of the trench 116. In one such embodiment, the high-κ dielectric 184 of the transistor 180 is continuous with the high-κ dielectric 156 of the capacitor 150, such as when the material is deposited in a single process or multiple processes. In other embodiments, the high-κ dielectric 156 of the capacitor 150 contacts the high-κ dielectric 184 of the transistor 180, but the two materials are compositionally distinct.

Note that in the example embodiment shown in FIG. 1A, the tops of the high-k dielectric 184 and the semiconductor material 182 are generally coplanar with the top surface 110a of the third isolation material 110. In other embodiments, such as shown in FIGS. 1B and 1C, the high-κ dielectric 184 and/or the semiconductor material 182 can extend above the top surface 110a of the third isolation material 110 by the same or different amounts, depending on the processing used, as will be appreciated.

Figure 2:
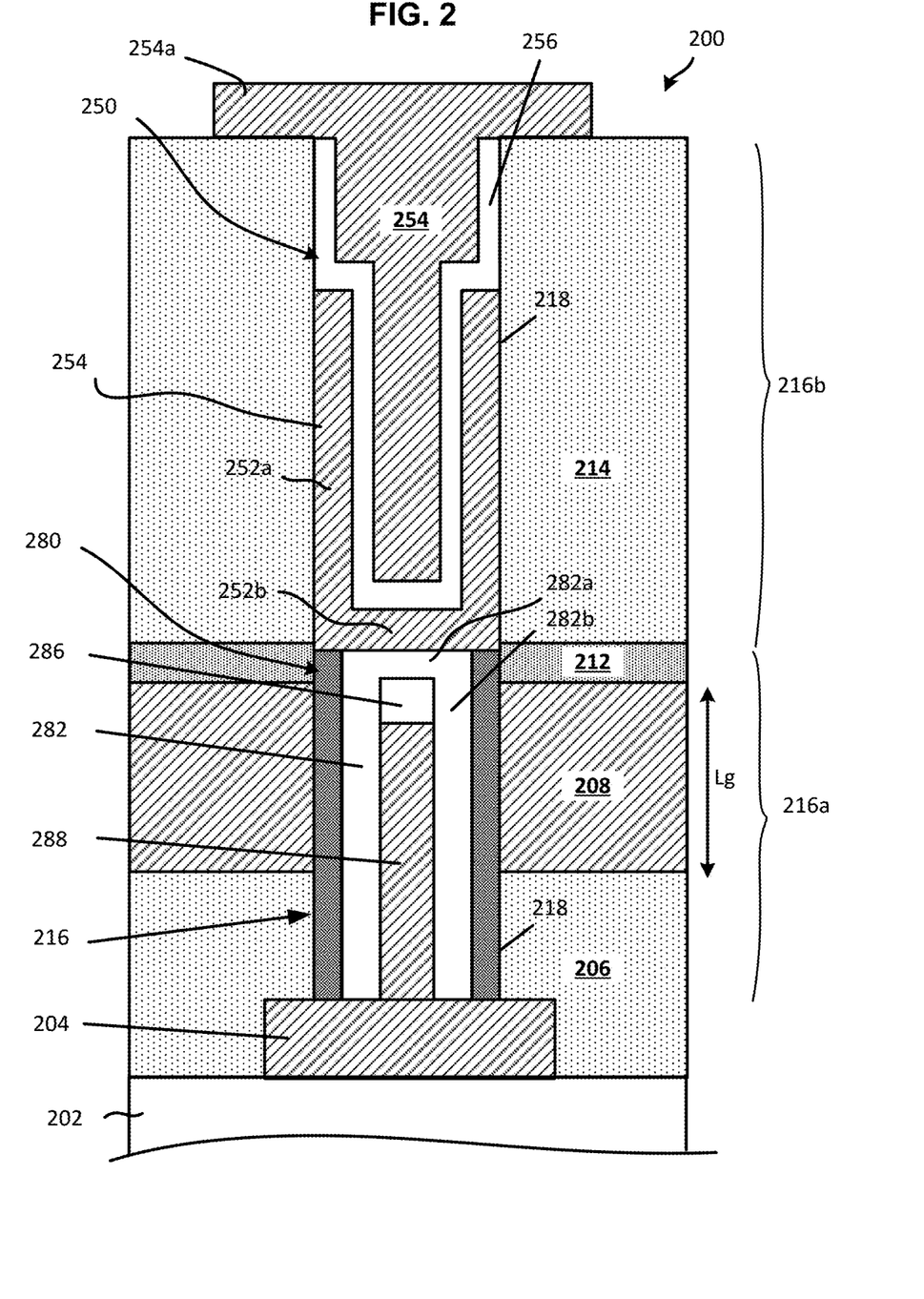
FIG. 2 is a cross-sectional view showing a memory cell with a capacitor structure vertically aligned over a transistor structure, in accordance with another embodiment of the present disclosure.

Referring now to FIG. 2, a cross-sectional view illustrates a memory cell 200 that includes a transistor 280 vertically aligned below a capacitor 250 in a bore or trench 216, in accordance with an embodiment of the present disclosure. In this example embodiment, the memory cell 200 is in a trench 216 that extends vertically through one or more isolation materials to a first conductor 204. In one embodiment, the first conductor 204 is bitline conductor in a layer of a first isolation material 206. In other embodiments, the first conductor 204 is on an insulating substrate or has an exposed top surface that is coplanar with a top surface of a substrate 202.

A second conductor 208 is on top of the layer of first isolation material 206. In some embodiments, the second conductor 208 is a wordline conductor and may comprise polysilicon, a metal, or other suitable material. A second isolation material 212 is on the second conductor 208 and electrically isolates the second conductor 212 from the capacitor structure and from the layer of third isolation material 214 above the second isolation material 212. The trench 216 includes a lower trench portion 216a and an upper trench portion 216b, where sidewalls 218 of the trench 216 are colinear along the upper and lower trench portions 216b, 216a. In one embodiment, the lower trench portion 216a is below the third isolation material 214 and the upper trench portion 216b is above the second isolation material 212. For example, the lower trench portion 116a corresponds to regions vertically even with or below the second conductor 208.

In general, the first isolation material 206, second isolation material 212, and third isolation material 214 each comprise an insulating or low-κ dielectric, such as silicon oxide (e.g., $SiO_2$), silicon nitride (e.g., $Si_3N_4$), silicon oxycarbide ($SiO_xC_y$), silicon carbide nitride (SiCN), or porous versions of any of these, to name a few examples. In some embodiments, the second isolation material 212 is compositionally distinct from the third isolation material 214 so as to enable etch selectivity between the two layers, as will be appreciated. Similarly, the first isolation material 206 can be compositionally distinct from the second isolation material 212 so as to enable etch selectivity between the two layers. In one example embodiment, the first and third isolation materials 206, 214 are $SiO_2$ and the second isolation material 212 is $Si_3N_4$, or vice versa. Numerous variations and embodiment will be apparent in light of the present disclosure.

Sidewalls 218 of the lower trench portion 216a are lined with a high-κ dielectric 284. The high-κ dielectric 284 extends vertically along the sidewalls 218 from the first conductor 204 at least to the layer of second isolation material 212. An electrode 288 (e.g., polysilicon) extends up from the first conductor 204 into the lower trench portion 216a between the lined sidewalls 218, and into the portion of the lower trench portion 216a wrapped by the second conductor 208. A layer of semiconductor material 282 is on the top and sides of the electrode 288 such that the semiconductor material 282 is between the electrode 288 and the high-κ dielectric along the sidewalls 218, such as having an inverted U-shape.

In some embodiments, an optional insulating dielectric 286 is on the top of the electrode 288 between the top portion 282a of the semiconductor material 282 and the electrode 288. In one example, the semiconductor material 282 generally defines an inverted U shape that conforms to the electrode 288, where side portions 282b of the inverted U-shape are between the electrode 288 and the high-κ dielectric 284, and where the top portion 282a of the inverted U-shape is on the insulating dielectric. In this example, the second conductor 208 surrounds or wraps around the outside of the transistor 280 in the lower trench portion 216a, where the high-κ dielectric 284 is between the second conductor 208 and the semiconductor material 282. The vertical thickness of the conductor 208 defines a gate length $L_g$.

The capacitor 250 is located in the upper trench portion 216b and is vertically aligned above the transistor 280. Similar to embodiments discussed above, the capacitor 250 includes a first capacitor electrode 252 and a second capacitor electrode 254 separated from one another by a layer of high-κ dielectric 256 therebetween. In this embodiment, the first capacitor electrode 252 has sidewall portions 252a that extend along the sidewalls 218 of the upper trench portion 216b. The first capacitor electrode 252 also has a bottom portion 252b that extends horizontally along the top of the high-κ dielectric 284 and the top portion 282a of the semiconductor material 282 in the lower trench portion 216a. In one example, the first capacitor electrode 252 generally has a U-shape, for example.

In one embodiment, the sidewall portions 252a of the first capacitor electrode 252 have a height that is less than the vertical size of the upper trench portion 216b. In other words, the sidewall portion 252a of the first capacitor electrode 252 extends only along part of the sidewall 218 of the upper trench portion 216b. In other embodiments, the sidewall portion 252a extends to the top of the trench 216. In either case, a layer of high-κ dielectric 256 lines the inside of the first capacitor electrode 252 and any portions of the sidewall 218 that are not lined by the first capacitor electrode 252. The second capacitor electrode 254 fills the region of the upper trench portion 216b between first capacitor electrode 252 and sidewalls 218 of the upper trench portion 216b such that the high-κ dielectric 256 is between and isolates the first capacitor electrode 252 from the second capacitor electrode 254. Optionally, the second capacitor electrode 254 includes a contact pad 254a above or on top of the third isolation material 214 for making electrical contact with other structures, as will be appreciated. Since the first capacitor electrode 252 (rather than the second capacitor electrode 254) contacts the transistor 280 in this embodiment, the polarity of the first and second capacitor electrodes 252, 254 may be reversed as needed compared to those in the embodiment of FIG. 1, as will be appreciated.

Fabrication

Figure 3:
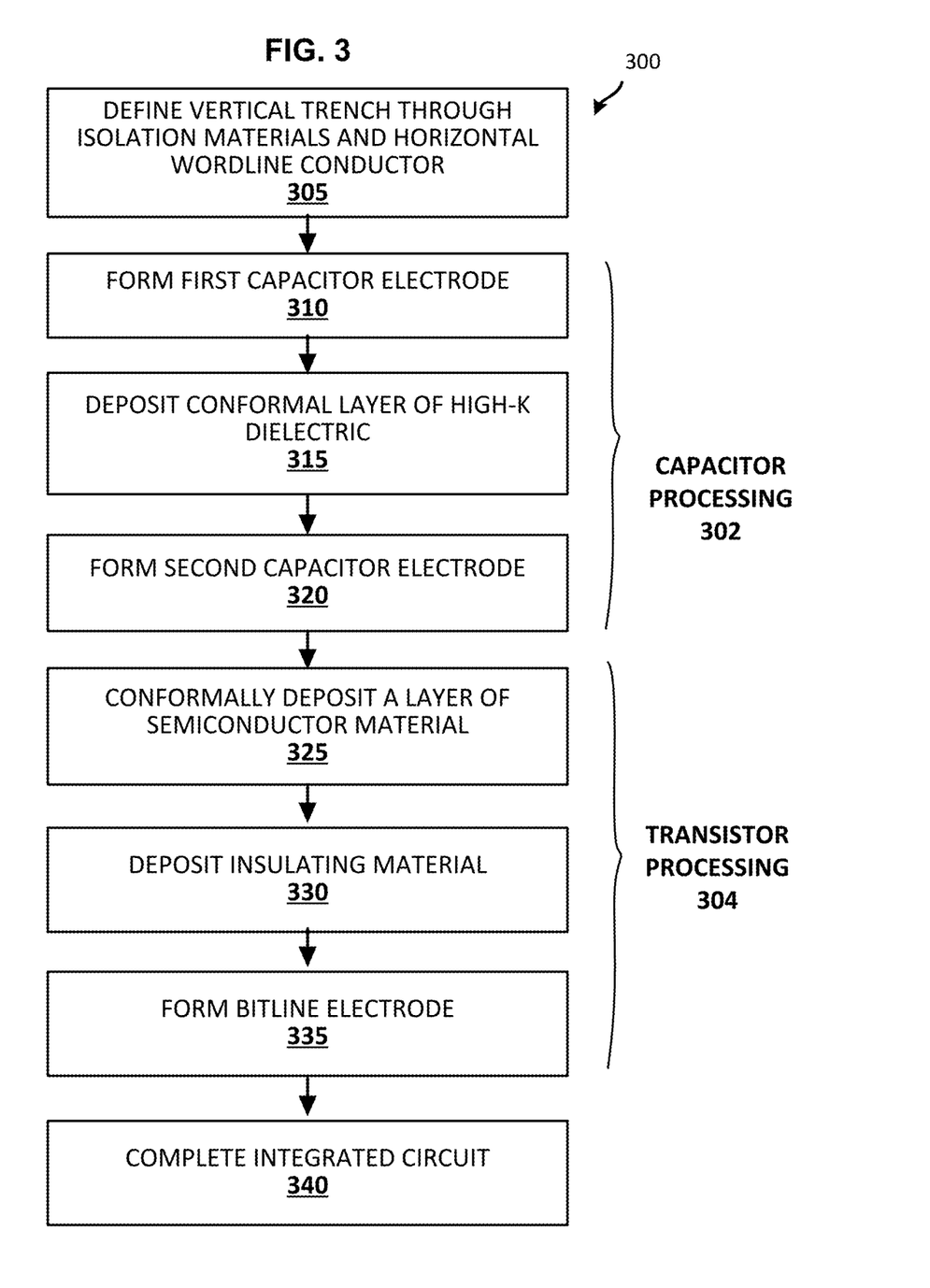
FIG. 3 illustrates a process flow for a method of fabricating a memory structure, in accordance with an embodiment of the present disclosure.

Referring now to FIG. 3 a flow chart illustrates processes in a method 300 of fabricating a memory cell that includes one transistor and one capacitor in a vertical, aligned arrangement, in accordance with some embodiments of the present disclosure. Method 300 is primarily discussed with reference to a memory cell in which the transistor is located above the capacitor; however, method 300 can be modified as needed in order to fabricate the memory cell with the capacitor on top of the transistor, in accordance with some embodiments. Along with the discussion of method 300, example structures at various stages of processing will be discussed and shown in FIGS. 4A-4G. In general, method 300 can be performed using any suitable semiconductor fabrication techniques, including deposition, photolithography, wet or dry chemical etching processes (e.g., atomic layer etch, plasma etch, SC1 etch), chemical mechanical polishing, deposition or epitaxial growth processes (e.g., CVD, PVD, ALD, VPE, MBE, LPE), melt regrowth, and/or any other suitable processing, as will be appreciated. Note that although method 300 is discussed in the context of fabricating a single memory cell, method 300 can be used to fabricate millions or billions of memory cells, as will be appreciated.

In one embodiment, method 300 begins with defining 305 a vertical trench extending through a wordline conductor that extends horizontally in an insulating material. The trench can have a circular, rectangular, or other cross-sectional shape with a diameter of less than 30 nm, in accordance with some embodiments. The trench extends through the wordline conductor and into the insulating material below the wordline conductor, defining a lower trench portion that is vertically below the wordline conductor and an upper trench portion that is surrounded in part by the wordline conductor. In some embodiments, the lower trench portion extends to expose a semiconductor material or conductor below the insulating material. In other embodiments, the trench terminates within the first insulating material above a substrate. Process 305 can be performed using suitable processing, such photolithographic patterning and anisotropic etch, for example.

Figure 4A:
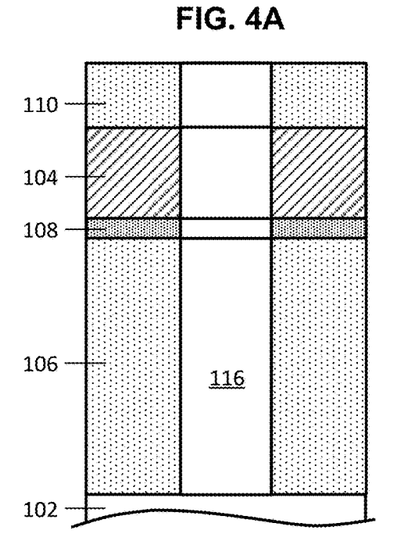
FIGS. 4A-4G illustrate cross-sectional views of example structures at various stages of processing in the method of FIG. 3, in accordance with some embodiments of the present disclosure.

FIG. 4A illustrates a cross-sectional view of an example structure that includes insulating material layers on a substrate 102, where a wordline 104 extends horizontally in the insulating material above the substrate 102. In one embodiment, the substrate 102 is a silicon, gallium arsenide, silicon on sapphire, epitaxial semiconductor layer, germanium, silicon germanium (SiGe) and/or like materials. Although illustrated as having a relatively small vertical thickness compared to the insulating materials above it, the substrate 102 can have any suitable thickness, including 1-950 µm, for example. On top of the substrate 102 are a first isolation material 106, a second isolation material 108, a wordline, 104, and a third isolation material 110, such as discussed above with reference to FIG. 1. In the example of FIG. 4A, the trench 116 extends through these material layers to the substrate 102.

In one embodiment, method 300 continues with processing 302 the capacitor structure, followed by processing 304 the transistor structure. In this example, processing 302 the capacitor structure beings with forming 310 the first capacitor electrode along the bottom and sidewalls of the lower trench portion. Process 310 can be performed, for example, by conformal deposition, epitaxial growth, in-situ doped epitaxial growth, or other suitable methods. The first capacitor electrode can be polysilicon, tungsten, molybdenum, silicide, or other suitable conductive material. Process 310 optionally may include recessing the first capacitor electrode in the trench to a level below the wordline, such as below the second isolation material beneath the wordline.

Figure 4B:
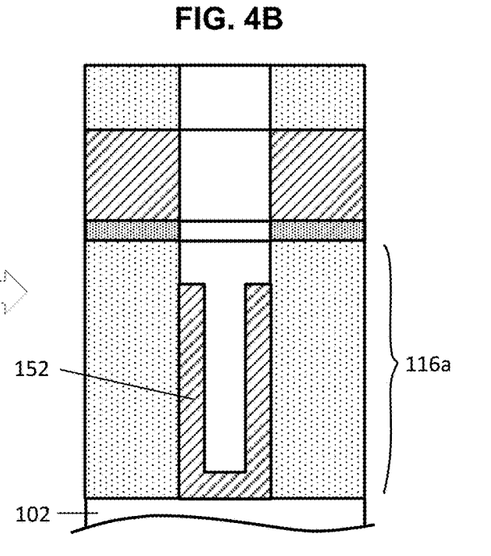

FIG. 4B illustrates the structure of FIG. 4A after conformal deposition of the first capacitor electrode 152 in the lower trench portion 116a and recessing as needed. In this example, the bottom of the first capacitor electrode 152 contacts the substrate 102.

Method 300 continues with conformally depositing 315 a layer of high-κ dielectric on the first capacitor electrode and sidewalls of the trench above the first capacitor electrode. In one embodiment, the layer of high-κ dielectric is deposited in a single process such that the dielectric extends along the sidewalls of the upper trench portion and is continuous with the dielectric in the lower trench portion and between the first and second capacitor electrodes. In other embodiments, the high-κ dielectric is processed in the lower trench portion, where the sidewalls of the upper trench portion are subsequently lined with dielectric material as part of processing the transistor structure. Numerous variations and embodiments will be apparent in light of the present disclosure. The high-κ dielectric can be tantalum oxide (TaO$_5$), oxygen-nitrogen-oxygen (ONO), hafnium oxide (HfO$_2$) to name a few examples. Process 315 can be performed using a conformal deposition process, such as atomic layer deposition (ALD).

Figure 4C:
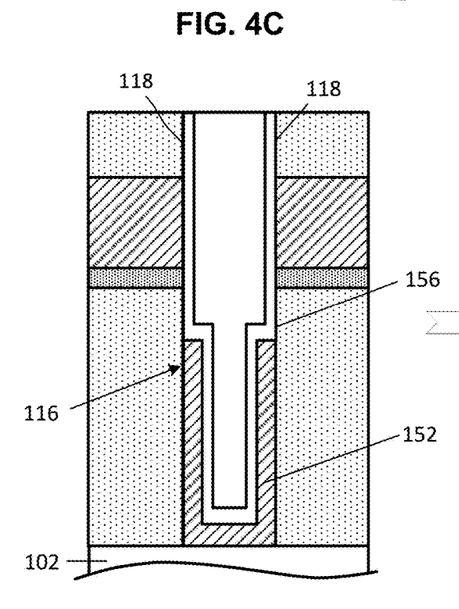

FIG. 4C illustrates a cross-sectional view of an example structure after depositing 315 a layer of high-κ dielectric 156 conformally along the first capacitor electrode 152 and sidewalls 118 of the trench 116 above the first capacitor electrode 152. In some embodiments, the high-κ dielectric 156 may remain on the top surface of the insulating material, such as shown in FIG. 1B.

Method 300 continues with forming 320 the second capacitor electrode. In one embodiment, process 320 is performed by filling the open regions of the lower trench portion 116a with a conductive material, such as doped polysilicon, tungsten, platinum, or other suitable conductive material. In some embodiments, process 320 is performed using thermal evaporation, vapor deposition, epitaxial growth, or other suitable method. The material of the second capacitor electrode is recessed as needed to a level below the upper trench portion, such as within the range of or below the second isolation material that lies just below the wordline.

Figure 4D:
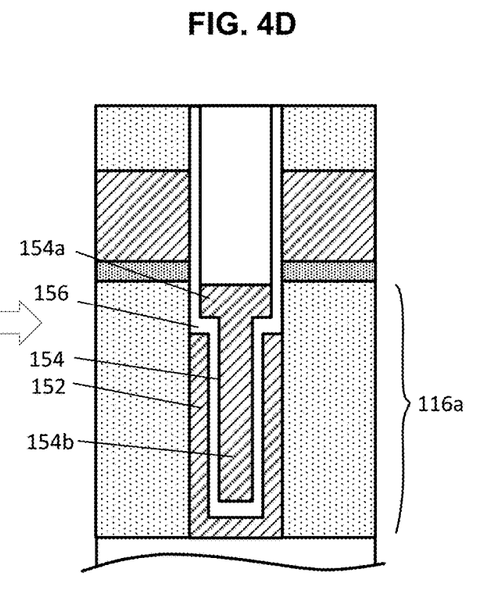

FIG. 4D illustrates a cross-sectional view of an example structure after forming the second capacitor electrode 154 in the lower trench portion 116a. As can be seen in FIG. 4D, the second capacitor electrode 154 is separated from the first capacitor electrode 152 by the high-κ dielectric 156. Also, the second capacitor electrode 154 includes a head portion 154a that is greater in horizontal size than a neck portion 154b between portions of the first capacitor electrode 152. The top surface of the head portion 154a is below the second isolation material 108.

Having processed 302 the capacitor structure, method 300 continues with processing 304 the transistor structure. In one embodiment, processing 304 the transistor structure begins with depositing 325 a layer of semiconductor material in the upper trench portion, which has its sidewalls lined with a high-κ dielectric. In some embodiments, the semiconductor material has a single-crystal, polycrystalline, or amorphous structure. For example, in embodiments suited for DRAM applications, the semiconductor material can be amorphous semiconductor material, such as hydrogenated amorphous silicon (a-Si:H), polysilicon, zinc oxide (ZnO), indium gallium zinc oxide (IGZO), indium-zinc oxide (IZO), indium-molybdenum oxide (IMO), and zinc-tin oxide (ZTO) to name a few examples. In other embodiments, the active layer can be any one of a variety of polycrystalline semiconductors including, for example, zinc oxynitride (ZnON, such as a composite of zinc oxide (ZnO) and zinc nitride (Zn$_3$N$_2$), or of ZnO, ZnO$_x$N$_y$, and Zn$_3$N$_2$), indium tin oxide (ITO), tin oxide (e.g., SnO), copper oxide (e.g., Cu$_2$O), polycrystalline germanium (poly-Ge) silicon-germanium (e.g., SiGe, such as Si$_{1-x}$Ge$_x$) structures (such as a stack of poly-Ge over SiGe), and the like. Process 325 can be performed using epitaxy, deposition techniques (e.g., CVD, PVD, ALD), or other suitable process.

Figure 4E:
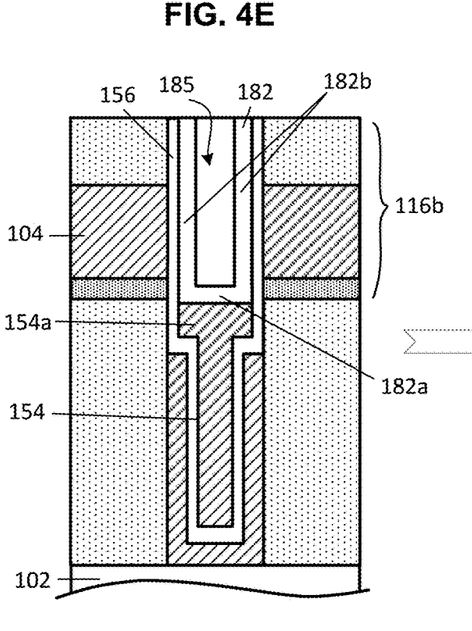

FIG. 4E illustrates a cross-sectional view of an example structure after depositing 325 a layer of semiconductor material 182 in the upper trench portion 116b. In this example, the bottom portion 182a of the semiconductor material 182 extends generally horizontally in contact with the second capacitor electrode 154 (e.g., along the head portion 154a). The semiconductor material 182 is isolated from the wordline by the layer of high-κ dielectric. The thickness of the semiconductor material 182 is from 2-10 nm in some embodiments, such that the semiconductor material 182 does not fill the entire upper trench portion 116b and so that it leaves a hollow region 185 between side portions 182b for formation of the bitline electrode therein.

Method 300 optionally continues with deposition 330 of an insulating dielectric in a lower portion of the hollow region between side portions of the layer of semiconductor material. In one embodiment, the insulating dielectric is an oxide (e.g., $SiO_2$ or $Al_2O_3$) or a nitride (e.g., $Si_3N_4$) deposited using chemical vapor deposition or other suitable deposition technique. Process 330 can include recessing the insulating dielectric as needed so that the insulating dielectric occupies only the lower portion of the hollow region, leaving room for the bitline electrode.

Figure 4F:
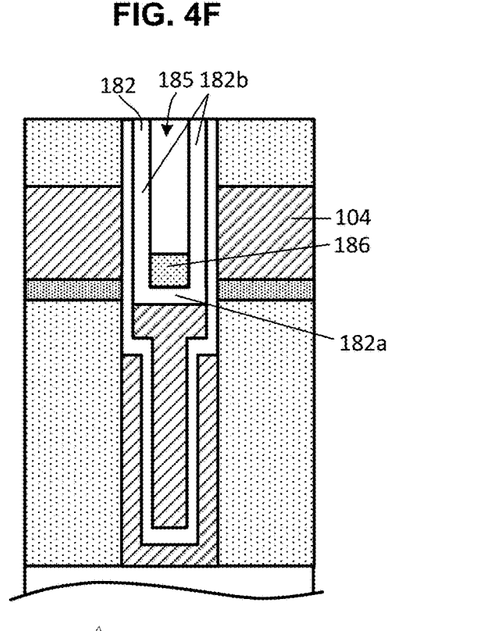

FIG. 4F illustrates a cross-sectional view of an example structure after depositing the insulating dielectric 186 in the hollow region 185 between the side portions 182b of the semiconductor material 182. In this example, the insulating dielectric 186 contacts the lower portion 182a of the semiconductor material 182 and leaves room for the bitline electrode to vertically overlap at least a portion of the wordline.

Figure 4G:
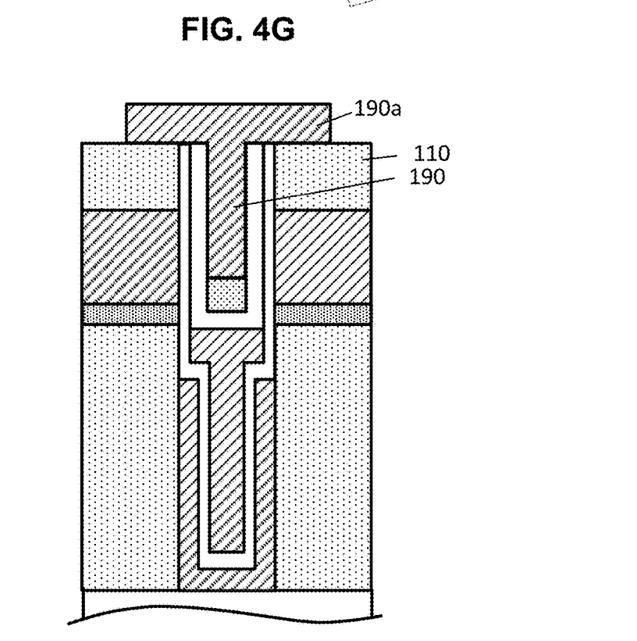

Method 300 continues with forming 335 the bitline electrode. The bitline electrode can be polysilicon, tungsten, tungsten silicide, aluminum, copper or copper alloy, titanium nitride, or other suitable conductive material deposited using any suitable deposition technique. In some embodiments, process 335 optionally includes masking on top of the third isolation material to define a contact pad or the like. FIG. 4G illustrates a cross-sectional view of an example structure after forming the bitline electrode 190 with a top portion 190a on top of the third isolation material.

Method 300 optionally continues with completing 340 the integrated circuit (IC) as desired. Such additional processing to complete an IC may include back-end or back-end-of-line (BEOL) processing to form one or more metallization layers and/or to interconnect the memory structures formed, for example. Any other suitable processing may be performed, as will be apparent in light of this disclosure.

In other embodiments of the method, processing 304 the transistor may occur prior to processing 302 the capacitor, such as when the transistor is located in the lower trench portion and the capacitor is located vertically above the transistor in the upper trench portion. In some such embodiments, method 300 may begin with defining 305 the vertical trench extending through a wordline conductor that extends horizontally in an insulating material, where the lower trench portion that is at the level of or vertically below the wordline conductor, and where the upper trench portion is above the wordline conductor. In one such embodiment, the transistor processing 304 includes depositing a liner along the sidewalls of the trench, forming the electrode extending up from the first conductor or substrate into the lower trench portion, depositing an insulating dielectric on top of the electrode, removing the liner and depositing a high-κ dielectric along sidewalls of the lower trench portion, then forming the semiconductor material in an inverted U-shape over the electrode where side portions of the semiconductor material are between the high-κ dielectric and the electrode. The capacitor can then be formed on top of the transistor in the upper trench portion using methodologies similar to those discussed above. Numerous variations and embodiments will be apparent in light of the present disclosure.

Note that the processes in method 300 are shown in a particular order for ease of description. However, one or more of the processes may be performed in a different order or may not be performed at all (and thus be optional), in accordance with some embodiments. For example, processing 302 the capacitor may be performed before or after processing 304 the transistor. Numerous variations on method 300 and the techniques described herein will be apparent in light of this disclosure.

Example System

Figure 5:
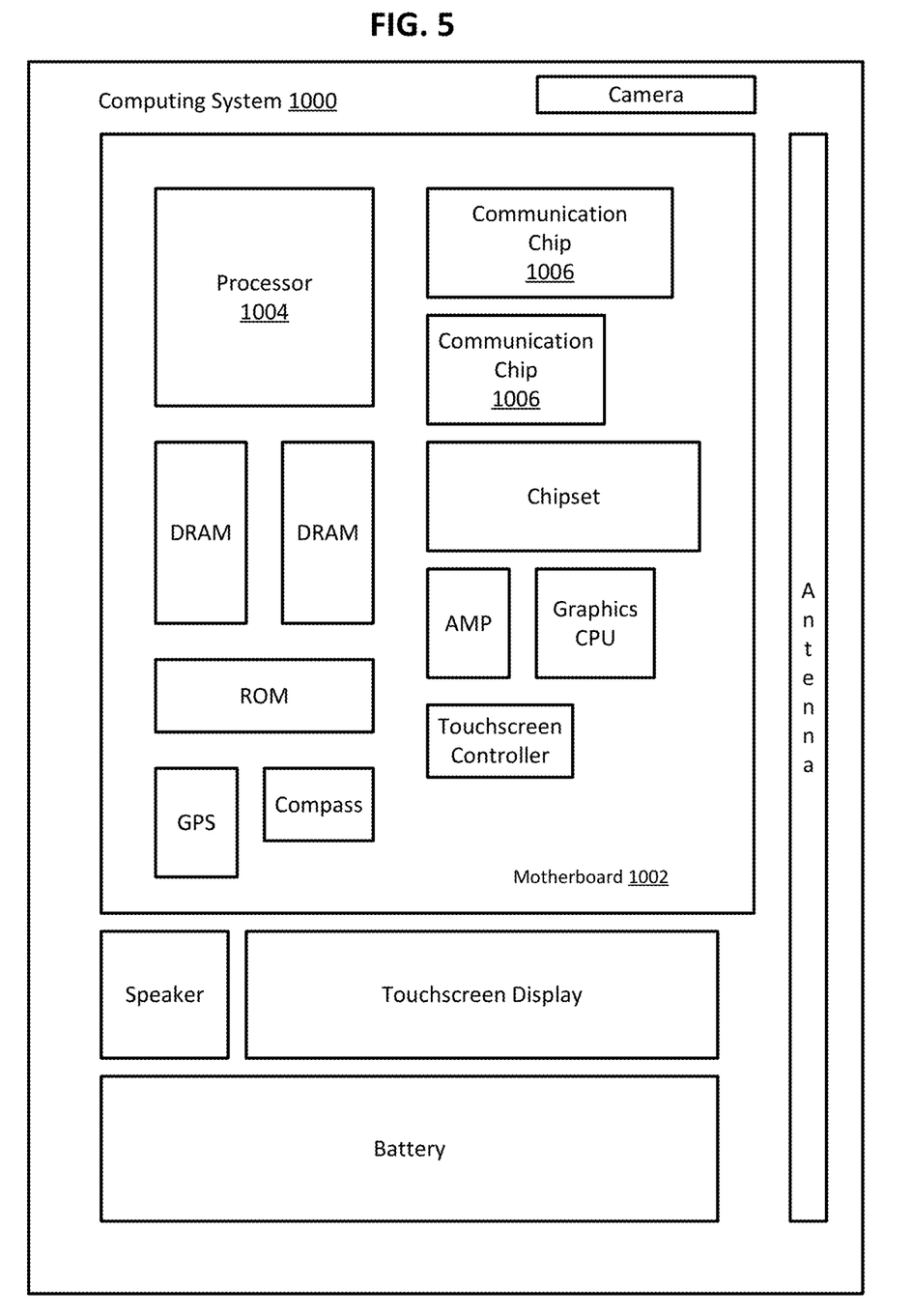
FIG. 5 illustrates an example computing system implemented with memory structures formed in accordance with some embodiments of the present disclosure.

FIG. 5 is an example computing system implemented with one or more of the memory structures as disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM, RRAM, SRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment (e.g., to include memory cells having a transistor vertically aligned with a capacitor, as variously provided herein). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more memory cell structures as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or memory cells as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or memory structures as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or memory structures formed using the disclosed techniques, as variously described herein.

Further Example Embodiments

The following examples pertain to further embodiments, from which numerous permutations and configurations will be apparent.

Example 1 is an integrated circuit comprising one or more layers of insulating material defining a vertical bore with a first portion and a second portion, wherein sidewalls of the first and the second portions are colinear. A capacitor structure is in the first portion of the vertical bore, where the capacitor structure includes a first electrode, a second electrode, and a first dielectric between the first electrode and the second electrode. A transistor structure is in the second portion of the vertical bore, where the transistor structure includes a third electrode extending into the second portion of the vertical bore, a layer of semiconductor material in contact with the third electrode and in contact with the second electrode, and a second dielectric between the semiconductor material and the insulating material. A fourth electrode is wrapped around at least a portion of the transistor structure, such that the second dielectric is between the semiconductor material and the fourth electrode. Sidewalls of the capacitor structure and the transistor structure are colinear.

Example 2 includes the subject matter of Example 1, where the transistor structure is in the first portion of the vertical bore, and the sidewall of the first portion is at least partly defined by the fourth electrode.

Example 3 includes the subject matter of Example 1, where the transistor structure is in the second portion of the vertical bore, and the sidewall of the second portion is at least partly defined by the fourth electrode.

Example 4 includes the subject matter of any of Examples 1-3, wherein the second dielectric of the transistor structure defines the sidewall of the transistor structure, and the first electrode defines at least part of the sidewall of the capacitor structure.

Example 5 includes the subject matter of any of Examples 1-4, wherein the second portion is above the first portion.

Example 6 includes the subject matter of Example 5, wherein the semiconductor material of the transistor structure is in contact with a top surface of the second capacitor electrode.

Example 7 includes the subject matter of Example 5, wherein the first dielectric between the first electrode and the second electrode is continuous with the second dielectric of the transistor structure.

Example 8 includes the subject matter of any of Examples 5-7, wherein the second electrode has a head portion and a neck portion extending down from the head portion, the neck portion between portions of the first electrode, the head portion having a lateral width that is greater than a lateral width of the neck portion.

Example 9 includes the subject matter of any of Examples 1-8, wherein the vertical bore passes through the insulating material and terminates on or in additional material underlying the insulating material.

Example 10 includes the subject matter of Example 9, wherein the additional material is a conductive material.

Example 11 includes the subject matter of Example 10, wherein the first portion of the vertical bore is a lower bore portion and the first electrode contacts the conductive material below the insulating material.

Example 12 includes the subject matter of any of Examples 1-11, wherein the one or more layers of insulating material includes a first layer of insulating material, a second insulating material on the first layer of insulating material, and a third insulating material over the second layer of insulating material, wherein the fourth electrode is on the second layer of insulating material and wherein the second layer of insulating material is compositionally distinct from the first layer of insulating material.

Example 13 includes the subject matter of any of Examples 1-12, wherein the third electrode is a bitline and the fourth electrode is a wordline.

Example 14 includes the subject matter of any of Examples 1-13, wherein the capacitor structure and the transistor structure are part of a vertical memory cell.

Example 15 includes the subject matter of Example 14, wherein the vertical memory cell is a DRAM cell.

Example 16 includes the subject matter of Example 1, wherein a thickness of the one or more layers of semiconductor material between the second dielectric and the third electrode is no greater than 10 nm.

Example 17 is an integrated circuit comprising a layer of insulating material on a base of semiconductor material; a first electrode of conductive material extending horizontally in the insulating material, wherein the electrode and the insulating material define a vertical bore extending through the first electrode; a capacitor structure in a lower bore portion below the first electrode, the capacitor structure including a first capacitor electrode and a second capacitor electrode separated by a high-κ dielectric; and a transistor structure in an upper bore portion, the transistor structure including a second electrode extending vertically into the upper bore portion, a layer of semiconductor material in contact with the second electrode and in contact with a top of the second capacitor electrode, and a high-κ dielectric between the semiconductor material and the first electrode, wherein the first electrode wraps around the transistor structure; wherein sidewalls of the capacitor structure and the transistor structure are colinear.

Example 18 includes the subject matter of Example 17, where the high-κ dielectric of the capacitor structure extends along the insulating material and the first electrode in the upper bore portion, and where the first capacitor electrode extends along the insulating material in the lower bore portion.

Example 19 includes the subject matter of Example 17, wherein a portion of the high-κ dielectric of the capacitor structure extends along the insulating material between the first capacitor electrode and the high-κ dielectric of the transistor structure.

Example 20 includes the subject matter of any of Examples 17-19, wherein the high-κ dielectric of the capacitor structure is continuous with the high-κ dielectric of the transistor structure.

Example 21 includes the subject matter of any of Examples 17-20, wherein the second capacitor electrode has a head portion and a neck portion extending down from the head portion, the head portion having a lateral width that is greater than a lateral width of the neck portion.

Example 22 includes the subject matter of Example 21, wherein the second capacitor electrode generally defines a T shape.

Example 23 includes the subject matter of Example 21, wherein the second capacitor electrode generally defines a lollipop shape.

Example 24 includes the subject matter of any of Examples 17-23, wherein the bore has a width of 50 nm or less.

Example 25 includes the subject matter of any of Examples 17-23, wherein the bore has a width of 30 nm or less.

Example 26 includes the subject matter of any of Examples 17-23, wherein the bore has a width of 20 nm or less.

Example 27 is a memory chip comprising the integrated circuit of any of Examples 1-26.

Example 28 includes the subject matter of Example 27 and further comprises a processor.

Example 29 includes the subject matter of Example 27 or 28, wherein the memory chip comprises a DRAM module.

Example 30 is a method of fabricating a vertical memory cell, the method comprising providing a substrate with a layer of insulating material on the substrate and including a conductor extending horizontally through the insulating material; defining a vertical bore in the insulating material, the vertical bore extending through the conductor; fabricating a capacitor structure in a first portion of the vertical bore, the capacitor structure having a first electrode and a second electrode wherein the first electrode is separated from the second electrode by a dielectric; and fabricating a transistor structure in a second portion of the vertical bore such that sidewalls of the capacitor structure and the transistor structure are colinear, wherein the conductor wraps around the transistor structure, and wherein the transistor structure includes a third electrode extending into the vertical bore, a film of semiconductor material on the third electrode, and a high-κ dielectric between the semiconductor material and the conductor.

Example 31 includes the subject matter of Example 30, where the first portion of the vertical bore is below the conductor and the semiconductor material contacts a top of the second electrode.

Example 32 includes the subject matter of Example 30, wherein the first portion of the vertical bore is above the second portion of the vertical bore, and wherein a bottom of the first electrode contacts a top of the semiconductor material.

Example 33 includes the subject matter of Example 30, wherein fabricating the capacitor structure comprises depositing the first electrode along a bottom and sidewalls of a lower portion of the bore below the conductor; conformally depositing a dielectric material on the first electrode and sidewalls of the vertical bore; and depositing a second electrode material in the lower portion of the bore between the dielectric material such that the second electrode is separated from the first electrode by the dielectric material.

Example 34 includes the subject matter of Example 33, wherein fabricating the transistor structure comprises depositing a film of semiconductor material in the upper portion of the bore, the layer of semiconductor extending along sidewalls of the upper portion of the bore and in contact with a top of the second capacitor electrode; and forming an electrode extending into the upper portion of the bore and in contact with the film of semiconductor material.

Example 35 includes the subject matter of Example 34 and further comprises depositing an insulating dielectric on the bottom portion of the semiconductor material between the side portions of the semiconductor material prior to forming the electrode.

Example 36 is a computing system comprising the integrated circuit of any of Examples 1-26.

Example 37 includes the subject matter of Example 36 and further comprises a touch screen display.

Example 38 includes the subject matter of Example 36 or 37 and further comprises a processor.

Example 39 includes the subject matter of Example 36-38 and further comprises a communication chip.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
   one or more layers of insulating material defining a vertical bore with a first portion and a second portion, wherein sidewalls of the first and the second portions are colinear;
   a capacitor structure in the first portion of the vertical bore, the capacitor structure including a first electrode, a second electrode, and a first dielectric between the first electrode and the second electrode, wherein the first electrode, the second electrode and the first dielectric are in the first portion of the vertical bore, wherein the first electrode has an uppermost surface, and wherein the first dielectric is on and covers the uppermost surface of the first electrode;

a transistor structure in the second portion of the vertical bore, the transistor structure including a third electrode extending into the second portion of the vertical bore, a layer of semiconductor material in contact with the third electrode and in contact with the second electrode, and a second dielectric between the semiconductor material and the insulating material; and a fourth electrode wrapped around at least a portion of the transistor structure, such that the second dielectric is between the semiconductor material and the fourth electrode;

wherein sidewalls of the capacitor structure and the transistor structure are colinear.

2. The integrated circuit of claim 1, wherein the transistor structure is in the first portion of the vertical bore, and the sidewall of the first portion is at least partly defined by the fourth electrode.

3. The integrated circuit of claim 1, wherein the transistor structure is in the second portion of the vertical bore, and the sidewall of the second portion is at least partly defined by the fourth electrode.

4. The integrated circuit of claim 1, wherein the second dielectric of the transistor structure defines the sidewall of the transistor structure, and the first electrode defines at least part of the sidewall of the capacitor structure.

5. The integrated circuit of claim 1, wherein the second portion is above the first portion.

6. The integrated circuit of claim 5, wherein the first dielectric between the first electrode and the second electrode is continuous with the second dielectric of the transistor structure.

7. The integrated circuit of claim 5, wherein the second electrode has a head portion and a neck portion extending down from the head portion, the neck portion between portions of the first electrode, the head portion having a lateral width that is greater than a lateral width of the neck portion.

8. The integrated circuit of claim 1, wherein the vertical bore passes through the insulating material and terminates on or in additional material underlying the insulating material.

9. The integrated circuit of claim 8, wherein the additional material is a conductive material.

10. The integrated circuit of claim 9, wherein the first portion of the vertical bore is a lower bore portion and the first electrode contacts the conductive material below the insulating material.

11. The integrated circuit of claim 1, wherein the one or more layers of insulating material includes a first layer of insulating material, a second insulating material on the first layer of insulating material, and a third insulating material over the second layer of insulating material, wherein the fourth electrode is on the second layer of insulating material and wherein the second layer of insulating material is compositionally distinct from the first layer of insulating material.

12. The integrated circuit of claim 1, wherein the third electrode is a bitline and the fourth electrode is a wordline.

13. The integrated circuit of claim 1, wherein the capacitor structure and the transistor structure are part of a vertical memory cell.

14. A memory chip comprising the integrated circuit of any of claim 1.

15. The memory chip of claim 14, wherein the memory chip comprises a DRAM module.

16. An integrated circuit comprising:
a layer of insulating material on a base of semiconductor material;
a first electrode of conductive material extending horizontally in the insulating material, wherein the electrode and the insulating material define a vertical bore extending through the first electrode;
a capacitor structure in a lower bore portion below the first electrode, the capacitor structure including a first capacitor electrode and a second capacitor electrode separated by a high-κ dielectric, wherein the first capacitor electrode, the second capacitor electrode and the high-κ dielectric are in the lower bore portion, wherein the first capacitor electrode has an uppermost surface, and wherein the high-κ dielectric is on and covers the uppermost surface of the first capacitor electrode; and
a transistor structure in an upper bore portion, the transistor structure including a second electrode extending vertically into the upper bore portion, a layer of semiconductor material in contact with the second electrode and in contact with a top of the second capacitor electrode, and a high-κ dielectric between the semiconductor material and the first electrode, wherein the first electrode wraps around the transistor structure;
wherein sidewalls of the capacitor structure and the transistor structure are colinear.

17. The integrated circuit of claim 16, wherein the high-κ dielectric extends along the insulating material and the first electrode in the upper bore portion, and wherein the first capacitor electrode extends along the insulating material in the lower bore portion.

18. The integrated circuit of claim 16, wherein a portion of the high-κ dielectric of the capacitor structure extends along the insulating material between the first capacitor electrode and the high-κ dielectric of the transistor structure.

19. The integrated circuit of claim 16, wherein the high-κ dielectric of the capacitor structure is continuous with the high-κ dielectric of the transistor structure.

20. The integrated circuit of claim 16, wherein the second capacitor electrode has a head portion and a neck portion extending down from the head portion, the head portion having a lateral width that is greater than a lateral width of the neck portion.

21. An integrated circuit comprising:
one or more layers of insulating material defining a vertical bore with a first portion and a second portion, wherein the second portion is above the first portion, and wherein sidewalls of the first and the second portions are colinear;
a capacitor structure in the first portion of the vertical bore, the capacitor structure including a first electrode, a second electrode, and a first dielectric between the first electrode and the second electrode, wherein the second electrode has a head portion and a neck portion extending down from the head portion, the neck portion between portions of the first electrode, the head portion having a lateral width that is greater than a lateral width of the neck portion, wherein the first electrode has an uppermost surface, and wherein the first dielectric is on and covers the uppermost surface of the first electrode;
a transistor structure in the second portion of the vertical bore, the transistor structure including a third electrode extending into the second portion of the vertical bore, a layer of semiconductor material in contact with the third electrode and in contact with the second electrode, and a second dielectric between the semiconductor material and the insulating material; and a fourth electrode wrapped around at least a portion of the transistor structure, such that the second dielectric is between the semiconductor material and the fourth electrode;

wherein sidewalls of the capacitor structure and the transistor structure are colinear.

22. An integrated circuit comprising:

one or more layers of insulating material defining a vertical bore with a first portion and a second portion, wherein sidewalls of the first and the second portions are colinear;

a capacitor structure in the first portion of the vertical bore, the capacitor structure including a first electrode, a second electrode, and a first dielectric between the first electrode and the second electrode;

a transistor structure in the second portion of the vertical bore, the transistor structure including a third electrode extending into the second portion of the vertical bore, a layer of semiconductor material in contact with the third electrode and in contact with the second electrode, and a second dielectric between the semiconductor material and the insulating material; and a fourth electrode wrapped around at least a portion of the transistor structure, such that the second dielectric is between the semiconductor material and the fourth electrode;

wherein sidewalls of the capacitor structure and the transistor structure are colinear, wherein the one or more layers of insulating material includes a first layer of insulating material, a second insulating material on the first layer of insulating material, and a third insulating material over the second layer of insulating material, wherein the fourth electrode is on the second layer of insulating material and wherein the second layer of insulating material is compositionally distinct from the first layer of insulating material.

* * * * *